(12) United States Patent
Choy et al.

(10) Patent No.: US 9,741,435 B1
(45) Date of Patent: Aug. 22, 2017

(54) SENSE AMPLIFIER CIRCUIT

(71) Applicant: FREESCALE SEMICONDUCTOR, INC., Austin, TX (US)

(72) Inventors: Jon Scott Choy, Austin, TX (US); Michael A. Sadd, Austin, TX (US); Michael Garrett Neaves, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/281,400

(22) Filed: Sep. 30, 2016

(51) Int. Cl.
G11C 11/00 (2006.01)
G11C 13/00 (2006.01)

(52) U.S. Cl.
CPC .... *G11C 13/004* (2013.01); *G11C 2013/0042* (2013.01)

(58) Field of Classification Search
CPC ..... G11C 7/065; G11C 11/4091; G11C 7/062; G11C 2207/063; G11C 11/1673; G11C 7/067; G11C 16/28; G11C 11/16; G11C 13/004; G11C 7/06; G11C 7/02; G11C 7/12; G11C 7/14; G11C 13/0002; G11C 2013/0054; G11C 11/4099
See application file for complete search history.

(56) References Cited

U.S. PATENT DOCUMENTS

| | | |
|---|---|---|
| 4,857,725 A | 8/1989 | Goodnough et al. |
| 6,990,030 B2 | 1/2006 | Lemus et al. |
| 8,693,273 B2 | 4/2014 | Yuh et al. |
| 8,837,210 B2 | 9/2014 | Jefremow et al. |
| 9,070,466 B2 | 6/2015 | Jefremow et al. |
| 9,076,540 B2 | 7/2015 | Mueller et al. |
| 9,224,464 B2 | 12/2015 | Chou et al. |
| 9,378,781 B1 | 6/2016 | Jung et al. |
| 9,384,792 B2 | 7/2016 | Bonaccio et al. |
| 2014/0063923 A1 | 3/2014 | Jefremow et al. |
| 2015/0063048 A1* | 3/2015 | Lin .................. G11C 7/062 365/210.1 |

OTHER PUBLICATIONS

U.S. Appl. No. 14/924,269, filed Oct. 27, 2015; entitled "Sense Path Circuitry Suitable for Magnetic Tunnel Junction Memories".
Andre, T., "ST-MRAM Fundamentals, Challenges, and Applications", 2013 Custom Integrated Circuits Conference, 2013 IEEE.

\* cited by examiner

*Primary Examiner* — Thong Q Le
(74) *Attorney, Agent, or Firm* — David G. Dolezal (57) ABSTRACT

A sense amplifier circuit includes a sampling capacitor coupled to the input of an inverting amplifier. The output of the inverting amplifier is coupled to a transistor that includes a current terminal. The memory read operation includes two phases. During a first phase, a terminal of the capacitor is coupled to a first cell. During a second phase, the terminal of the capacitor is coupled a second cell.

23 Claims, 7 Drawing Sheets

SENSE AMPLIFIER CIRCUIT

BACKGROUND OF THE INVENTION

Field of the Invention

This invention relates in general to a memory circuit and more specifically a sense amplifier circuit for a memory circuit.

Description of the Related Art

Some memory circuits utilize sense amplifier circuits for reading the storage states of memory cells of a memory circuit. Some sense amplifier circuits include a reference path that includes reference cell and a sense path that is coupled to the cell being read during a read operation. In some examples, a current of the reference path is mirrored and compared to a current of the sense path for determining the storage state of the memory cell being read.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a sense amplifier circuit includes a sampling capacitor that during a first phase of a memory read operation, stores a voltage dependent upon a reference node voltage of a reference path of the sense amplifier circuit. The sense amplifier circuit includes an inverting amplifier whose output controls the conductivity of a transistor. During a second phase of the read operation, the sampling capacitor is coupled to a sense node of the sense path that includes the memory cell being read. The voltage of the sampling capacitor is used to control the voltage of the output of the amplifier to replicate the reference node voltage at the sense node of the sense path. The sense amplifier circuit includes an output node that during the second phase, is indicative of the storage state of the memory cell being read. In other embodiments, the sampling capacitor stores a voltage dependent upon a sense node voltage of a sense path of the sense amplifier circuit during the first phase of a memory read operation and during the second phase, the voltage of the sampling capacitor is used to control the voltage of the output of the amplifier to replicate the sense node voltage at the reference node of the reference path. In still other embodiments, the sampling capacitor stores a voltage dependent upon the voltage of a first node coupled to one complementary memory cell of a pair of complementary memory cells during the first phase of a memory read operation, and during the second phase, the voltage of the sampling capacitor is used to control the voltage of the output of the amplifier to replicate the voltage of the first node at a second node coupled to the other complementary memory cell of the pair of complementary memory cells.

With some prior art sense amplifier circuits, a reference current generated in a reference path is mirrored and compared against a current generated in a memory cell being read that is part of a sense path. The voltage of an output node is dependent upon the resistive value of the memory cell. However, mismatches between devices (e.g. transistors) of the reference path and the sense path can cause erroneous voltages at the output node, especially if the sensing window between the reference path current and the sense path current is small. Some prior art sense amplifier circuits use source follower devices in the reference path and memory cell path. Mismatches in the source follower devices when mirroring the current during a read operation can be a source of erroneous voltage readings.

Accordingly, with some embodiments of sense amplifier circuits described herein, a capacitor is used to sample a voltage that is based on a reference node voltage in the reference path during a first phase of a memory read operation and then the sampled voltage is used to control the conductivity of a transistor coupled to the memory cell to replicate the reference node voltage in a node of the sense path during a second phase of a memory read operation. With other embodiments, the capacitor is used to sample a voltage that is based on the sense node voltage during a first phase of a memory read operation and then the sampled voltage is used to control the conductivity of a transistor coupled to the reference cell to replicate the sense node voltage in the reference node during a second phase of a memory read operation. With other embodiments, the capacitor is used to sample a voltage that is based on the voltage of a first node coupled to one complementary memory cell during a first phase of a memory read operation and then the sampled voltage is used to control the conductivity of a transistor to replicate the voltage in a second node coupled to the other complementary memory cell during a second phase of a memory read operation.

Figure 1:
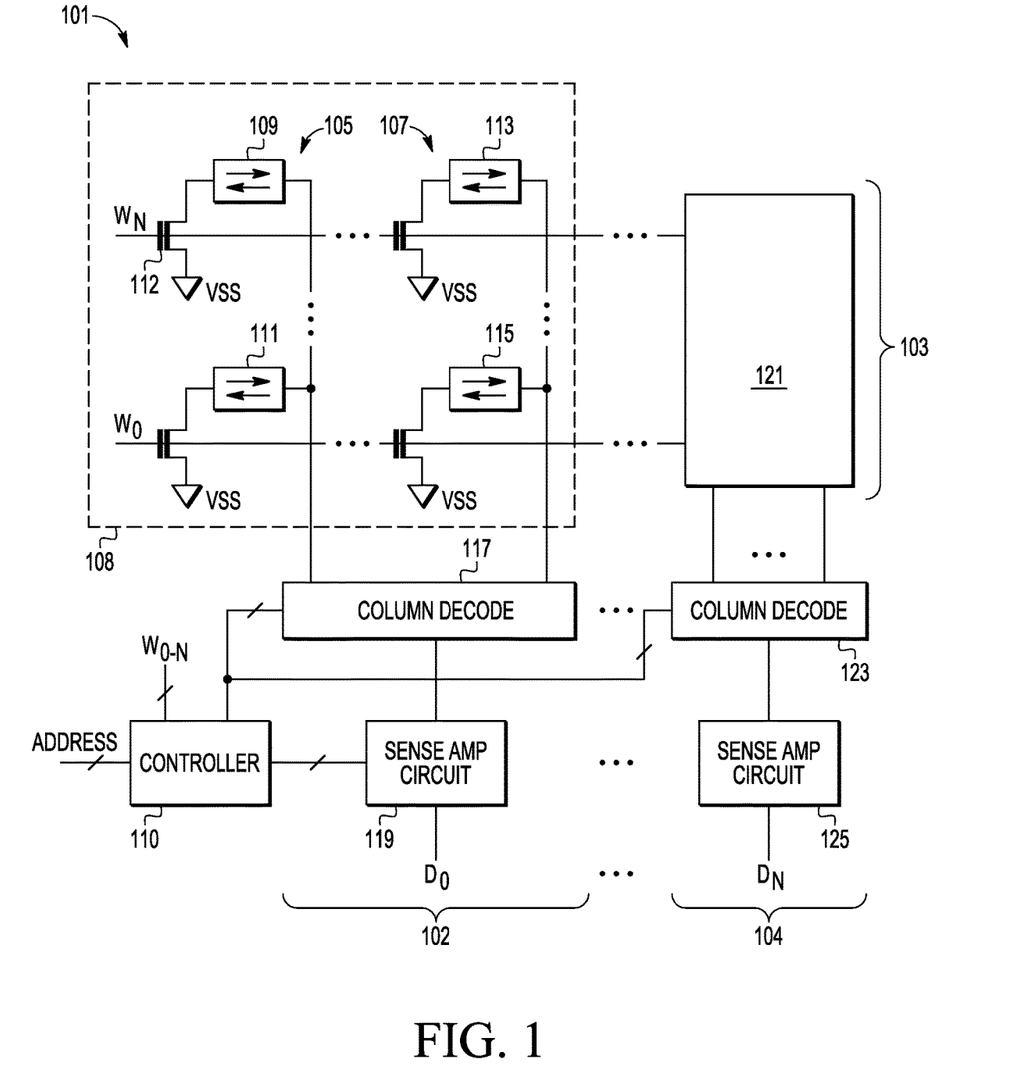
FIG. 1 is a circuit diagram of a memory circuit according to one embodiment of the present invention.

FIG. 1 is a circuit diagram of a memory circuit according to one embodiment of the present invention. Memory circuit 101 includes a memory array 103. In the embodiment shown, memory array 103 includes resistive memory cells (e.g. 109, 113, 111, and 115) located in rows and columns. In the embodiment shown, memory array 103 includes two array segments, segment 108 and segment 121. The memory cells of segment 121 are not shown in FIG. 1. Each segment includes a number of cells that are individually accessible by asserting a specific word line (W0 . . . WN) and by selecting the appropriate column (105, 107) by column decode circuitry 117 and 123. The word lines are each connected to access transistors (112) of a cell of a column that are made conductive when the word line is asserted.

A cell of array segment 108 can be read by sense amplifier circuit 119 and a cell of array segment 121 (cells not specifically shown) can be read by sense amplifier circuit 125. Sense amplifier circuits 119 and 125 each produce a data bit (D0, DN, respectively) that is indicative of the storage state of the memory cell of the memory segment being read during a read operation. The specific cell of the segment being read is determined by an address provided to controller 110. Controller 110 asserts the appropriate word line and selects the appropriate columns via the column decode circuitry (117, 123) to couple the cells being read to the sense amplifier circuits (119, 125).

In some embodiments, the memory cells (109, 113, 111, and 115) of array 103 are resistive memory cells. In one embodiment, the cells are MRAM cells, but may be of other types of resistive memory cells in other embodiments such as ReRAM cells, carbon nanotube cells, phase change cells, cross point, or programmable metallization cells. A resistive memory cell is a memory cell capable of having different resistive values with each resistive value indicative of a storage state of the memory cell. In other embodiments, array 103 may include other types of memory cells. In one embodiment, the memory cells have two storage states. With one storage state, the memory cell has a high resistive value, and with the other storage state, the memory cell has a low resistive value. In one embodiment, the memory cells of array 103 are non-volatile in that they retain their memory state without being powered by a power source. In other embodiments, array 103 may store data values in complementary memory cells.

Although the memory circuit in FIG. 1 shows two rows, two array segments (108, 121), two columns per array segment, and two sense amplifier circuits (119 and 125), other memory circuits may include a different number of rows, array segments, columns per array circuit, and/or sense amplifier circuits. Also, in other embodiments, memory circuit 101 may have other configurations and/or include other circuitry in other embodiments. Memory circuit 101 may be implemented in a standalone integrated circuit or may be integrated with other circuitry (e.g. a processor, peripherals, not shown) in an integrated circuit.

Figure 2:
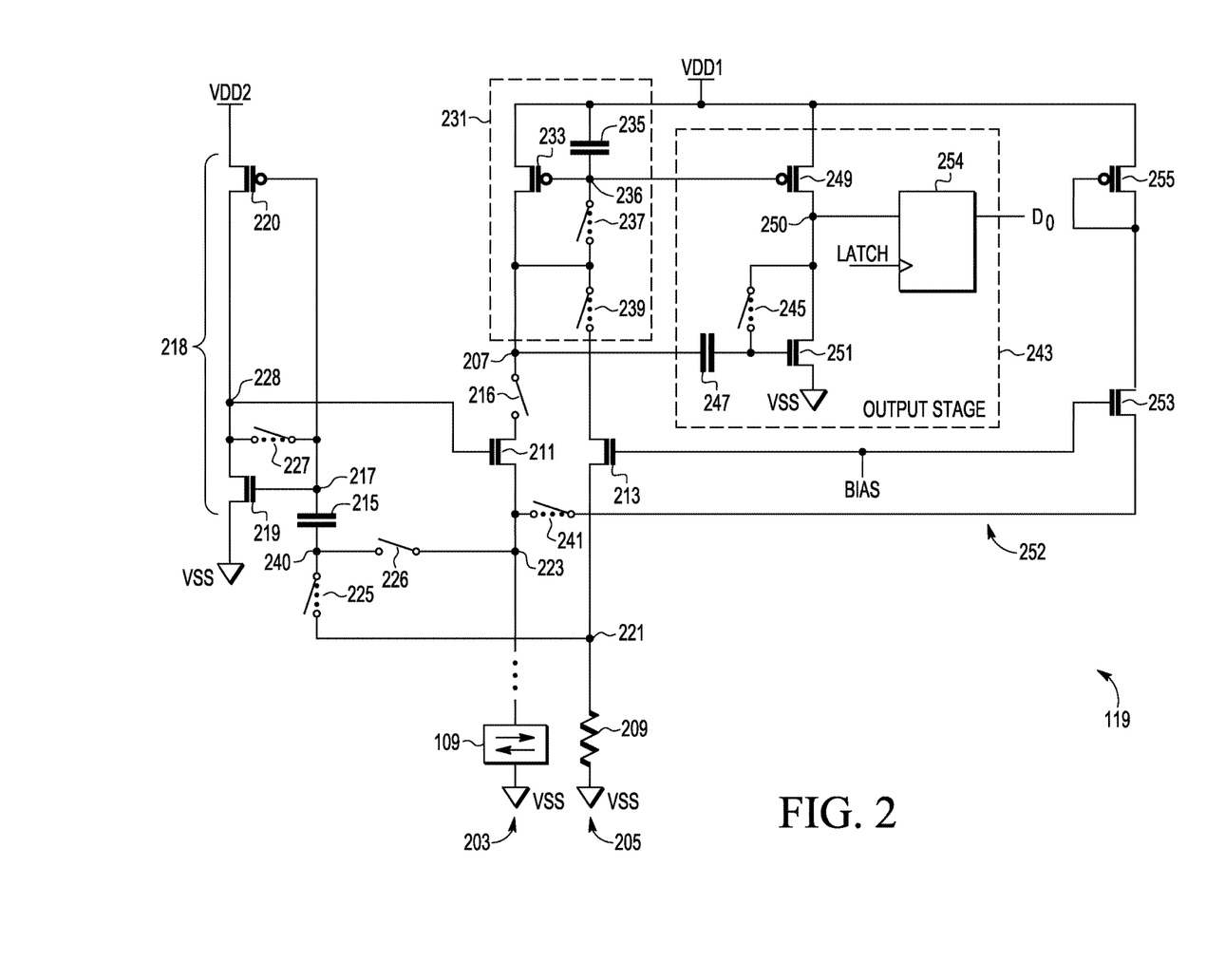
FIG. 2 is a circuit diagram of a sense amplifier circuit showing a phase of a memory read operation according to one embodiment of the present invention.

FIG. 2 is a circuit diagram of one embodiment of sense amplifier circuit 119. Sense amplifier circuit 119 is shown in FIG. 2 during a first phase of a memory read operation of cell 109. Sense amplifier circuit 119 includes a reference path 205 and a sense path 203. During a read operation, sense path 203 is coupled to memory cell 109 by a bit line and column decode circuitry 117 (not shown) in FIG. 1. Cell 109 is coupled to supply voltage VSS (system ground in some embodiments) by access transistor 112 (not shown in FIG. 2) being made conductive by an asserted word line.

Reference path 205 includes a reference cell 209. In one embodiment, reference cell 209 is located in the same area of an integrated circuit as the array segment of the memory cell being read and is the same type of device. In one embodiment, reference cell 209 has a resistance value that is approximately equal distant from the typical resistance values of the memory cells in the low resistance storage state and the typical resistance values of the memory cells in the high resistance storage state. In other embodiments, reference cell may have a high resistance state value or a low resistance state value. In some embodiments, the typical resistance value of a memory cell in the low resistance state may be in the range of 1-5K ohms, the typical resistance value of a memory cell in the high resistance state may be in the range of 2-10K ohms, and the resistance value of the reference cell may be in the range of 1.5-7.5K ohms, depending upon the embodiment. However, other embodiments may utilize other resistive values. In some embodiments, reference cell 209 is physically located with the rest of the sense amplifier circuit devices wherein the resistance between the memory cells (109) of array 103 (including the decoder circuitry and access transistors) and node 223 is reflected in the resistance value of reference cell 209. In one embodiment, the reference cell may include multiple resistive elements. For example, cell 209 may include two legs in parallel with each leg including a high resistive cell element and a low resistive cell element in series. In some embodiments, different reference cells may be used during different memory read operations depending upon which memory cell is being read. In one embodiment, other devices (e.g. switches) may be located between cell 209 and node 221.

Reference path 205 includes a reference node 221 that is connected to a source of NMOS transistor 213. The drain of transistor 213 is connected to switch 239. Switch 239 is connected switch 237, which is connected to node 236, which is connected to a terminal of sampling capacitor 235. The other terminal of capacitor 235 is coupled to supply voltage VDD1. Node 236 is connected to the gate of PMOS transistor 233. The source of transistor 233 is coupled to supply voltage VDD1 and the drain of transistor 233 is connected to switches 237 and 239 and to output node 207. Transistor 233, capacitor 235, and switches 237 and 239 are utilized as a dynamic current mirror 231.

Output node 207 of memory cell path 203 is connected to switch 216 which is connected to the drain terminal of transistor 211. The source of transistor 211 is connected to switch 241 and node 223. Node 223 is connected to switch 226 and coupled to the memory cell being read (e.g. 109) during a memory read operation. In the embodiment shown, transistor 211 is used to implement a source follower.

Circuit 119 includes a sampling capacitor 215 that has a terminal that can be coupled to node 223 via switch 226 and coupled to node 221 via switch 225. In the embodiment shown, the other terminal of capacitor 215 is connected to the gate of transistor 219 and transistor 220 at node 217. It is also connected to switch 227. Transistors 220 and 219 are used to implement an inverting amplifier, which in the embodiment shown is a two transistor inverter 218 with the gates of the two transistors connected to the input (node 217) of inverter 218 and the drains of the two transistors connected to the output (node 228) of inverter 218. The output (node 228) is connected to the gate of transistor 211. In some embodiments, a switch may be located between the gate of transistor 211 and node 228 that is closed during a second phase of a memory read operation (as discussed below). A switch may also be located between the gate of transistor 219 and node 217 that is conductive during a second phase of a memory read operation.

In the embodiment shown, the source of transistor 220 is coupled to power supply voltage node VDD2 which is different from the voltage of supply voltage node VDD1. In one embodiment, VDD1 is 1.0 volts and VDD2 is 1.2 volts, however these voltages may be of other values in other embodiments. In some embodiments, the source of transistor 220 may be coupled to the supply voltage VDD1. In some embodiments, providing different supply voltages for VDD1 and VDD2 may allow for an optimization of the design of circuit 119 for cost and performance. For example, the portion of circuit 119 shown in FIG. 2 being supplied with VDD1 may benefit in lower power consumption from the lower supply voltage VDD1 while inverter 218 being used as an inverting amplifier benefits from the higher supply voltage VDD2 which allows more voltage headroom for cascoding, thereby producing a beneficial higher gain.

Circuit 119 includes a pre-charge circuit 252 that includes diode configured transistor 255, transistor 253, and switch 241. The gates of transistors 213 and 253 are coupled to a BIAS signal (from controller 110). During a first phase of a memory read operation, switch 241 is closed to pre-charge node 223 to a pre-charge voltage e.g. 100 mV. The pre-charge voltage provided by pre-charge circuit 252 is set by the BIAS voltage provided to the gate of transistor 253. In one embodiment, the BIAS voltage is provided by a reference voltage source (not shown). The BIAS voltage is also provided to the gate of transistor 213.

Circuit 119 includes an output stage 243 coupled to output node 207. In the embodiment shown, output stage includes a capacitor 247 connected to node 207, transistor 251, transistor 249, and latch 254. Latch 254 includes a data input and a latch input. Latch 254 includes an output that provides an indication of the data value (D0) stored in memory cell 109. Output stage 243 is an inverted output stage in that the voltage value state of node 207 corresponding to a storage state of memory cell 109 is opposite the voltage value state of output signal D0. Sense amplifier circuit 119 may have other types of output stages in other embodiments.

In one embodiment, capacitor 235 is implemented with a transistor structure configured as a capacitor and capacitors 215 and 247 are implemented as fringing capacitors. However, the capacitors may be implemented by other structures in other embodiments.

Sense amplifier circuit 119 implements a two phase memory read operation. In FIG. 2, the switches that are closed during Phase 1 and open during Phase 2 are shown with dots between the two switch terminals. Those switches without dots are open during Phase 1 and closed during Phase 2. For example, switches 227, 225, 241, 237, 239, and 245 are closed during Phase 1 and open during Phase 2. Switches 216 and 226 are open during Phase 1 and closed during Phase 2. In one embodiment, the switches are controlled by signals provided by controller 110 (see FIG. 1). In one embodiment, the switches are implemented by transistors (e.g. NMOS transistors). In other embodiments, the switches may be implemented by other types of switching devices (e.g. pass gates, PMOS transistors). In one embodiment, Phase 1 is characterized as a pre-charge phase and Phase 2 is characterized as a sense phase.

During Phase 1, switches 237 and 239 are closed such that transistor 233 is connected in gated diode fashion and captures the reference current through reference path 205. The voltage for biasing the gate of transistor 233 is sampled by capacitor 235. The BIAS signal applied to the gate of transistor 213 sets the voltage at reference node 221. The BIAS signal also sets the pre-charge voltage of node 223. Also in Phase 1, switches 225 and 227 are closed such that sampling capacitor 215 samples the voltage between the node 221 and node 228.

During Phase 1, switch 245 is closed, node 207 is biased to a diode connected drop from VDD1, and node 250 is biased to a diode connected rise from VSS. Because the voltage at the node between switch 245 and capacitor 247 is biased at the edge of the trip point of the inverting circuit of transistor 249 and transistor 251, during Phase 2 of the read operation, that node will freely drive the output of the inverting circuit to VDD1 or VSS once switch 245 is opened.

Figure 3:
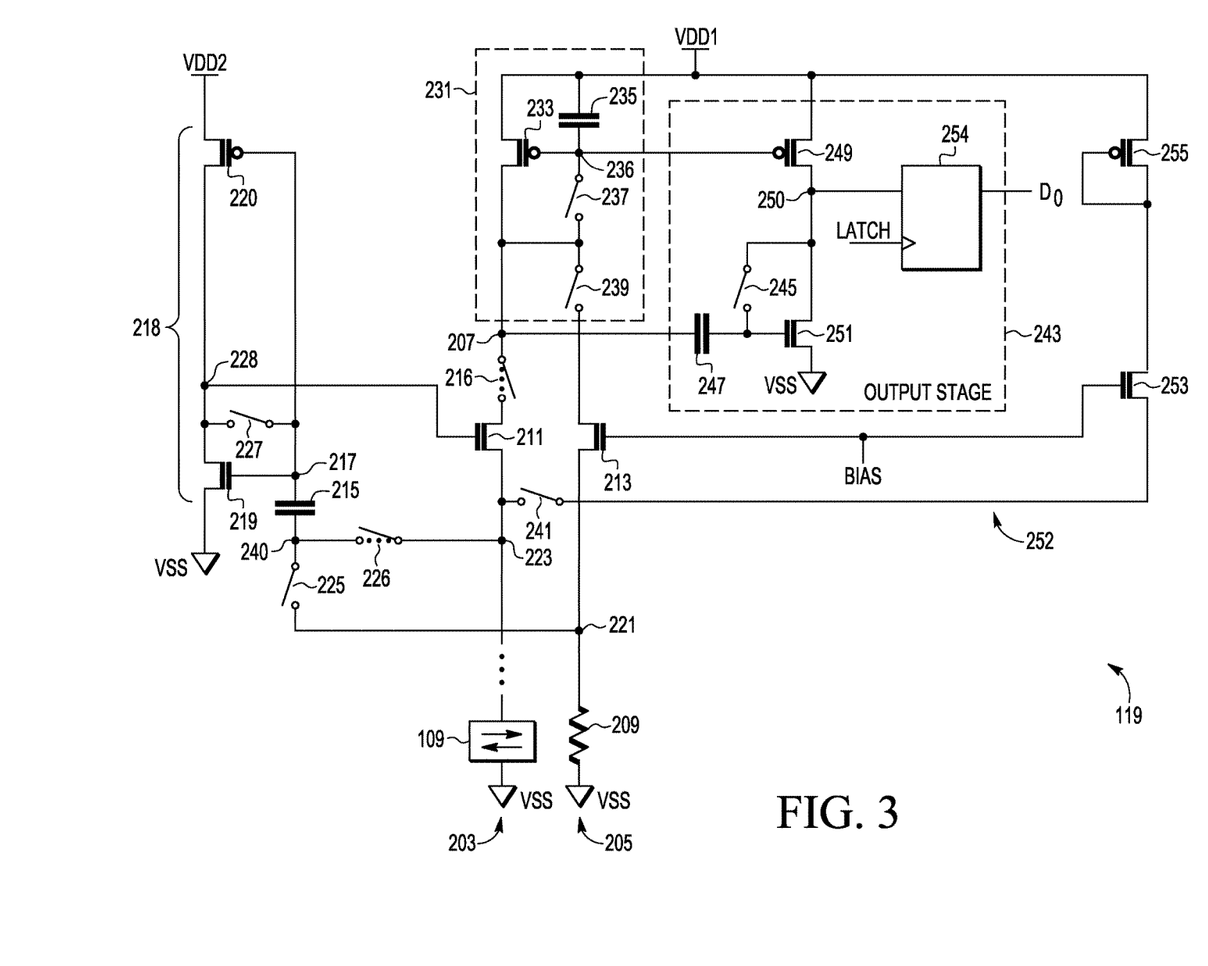
FIG. 3 is a circuit diagram of a sense amplifier circuit showing another phase of a memory read operation according to one embodiment of the present invention.

FIG. 3 shows sense amplifier circuit 119 during Phase 2 of a read operation. The switches that are closed during Phase 2 (switches 216 and 226) are shown with dashed lines connecting the terminals of the switch. All other switches of circuit 119 are open during Phase 2.

During Phase 2, switches 237 and 239 are open, thereby isolating the reference path 205 from transistor 233. The gate of transistor 233 is biased at the voltage sampled in capacitor 235. With the closing of switch 216, the reference current produced by transistor 233 is transferred to sense path 203 and transistor 233 is used as a load to be compared against the resistance of memory cell 109.

In Phase 2, the output node 228 of the inverting amplifier (inverter 218) controls the voltage of the gate of the source follower device (transistor 211) such that the voltage of node 221 set in Phase 1 is replicated at sense node 223 during Phase 2, regardless of the resistive state of the memory cell 109. The closure of switch 226 creates a feedback loop through capacitor 215, the input (node 217) of inverter 218, and through the output 228 of inverter 218 to control the conductivity of transistor 211 to maintain the voltage at sense node 223. Because switch 227 opens in Phase 2, capacitor 215 does not discharge and acts like a voltage level shifter coupled between node 228 and node 223.

During Phase 2, dynamic current mirror 231 attempts to provide a pullup current equal to the reference current sampled during Phase 1. Also, during Phase 2, the feedback loop (described above) attempts to hold the voltage at node 223 to the reference node voltage which was sampled in Phase 1. The transistor 211 attempts to provide a pulldown current determined by the voltage at node 223 divided by the resistance of the memory cell.

Memory cell 109 being in a high resistive state results in transistor 211 having a pulldown capability less than the pullup capability of the dynamic current mirror 231, which results in node 207 rising to a higher voltage in Phase 2 than the voltage on node 207 during Phase 1. On the other hand, memory cell 109 in a low resistive state results in transistor 211 having a pulldown capability greater than the pullup capability of the dynamic current mirror 231, which results in node 207 falling to a lower voltage in Phase 2 than the voltage on node 207 during Phase 1.

Also, during Phase 2, switch 245 is open. The voltage stored on capacitor 247 during Phase 1 remains stored on the capacitor during Phase 2, which allows the voltage on node 207 during Phase 2, as compared to the voltage on node 207 during Phase 1, to change the voltage on the gate of transistor 251. A change in the voltage on the gate of transistor 251 changes the current pulldown capability of transistor 251. If the voltage on node 207 is higher during Phase 2 than during Phase 1, then transistor 251 has higher pulldown capability during Phase 2 and node 250 is pulled down to near VSS. If the voltage on node 207 is lower during Phase 2 than during Phase 1, then transistor 251 has less pulldown capability during Phase 2 and node 250 is pulled up to near VDD1.

Using reference cell 209 to set voltages in Phase 1 of a memory read operation that will be used to bias corresponding nodes in the sense path in Phase 2 of the memory read operation may provide for a more accurate sense amplifier circuit. For example, sampling a voltage of a reference node of a reference path in a first phase and then replicating that voltage at a corresponding node of the sense path in the second phase may reduce the error from device mismatches that may occur if the current of the reference path were contemporaneously mirrored in the sense path. Furthermore, sampling the bias voltage for the gate of transistor 233 with capacitor 235 in the first phase and then controlling the voltage of the gate with the sampled voltage in the second phase may also eliminate the error that occurs from the mismatch of two PMOS transistors to contemporaneously mirror the current from the sense path to the reference path.

Utilizing an inverting amplifier (e.g. inverter 218) in the feedback loop provides for a faster settling time of the voltage of node 207 in transitioning to its appropriate voltage level based on the resistive state of the memory cell being read.

In one embodiment, sampling capacitor 215 is utilized for shifting from the reference bias at node 221 to the common mode voltage of the feedback loop (node 223, capacitor 215, inverter 218, and transistor 211), which may be beneficial for reading resistive memory cells such as MRAM cells that require a relatively low voltage to be applied during a read operation to avoid disturbing the cell.

Figure 4:
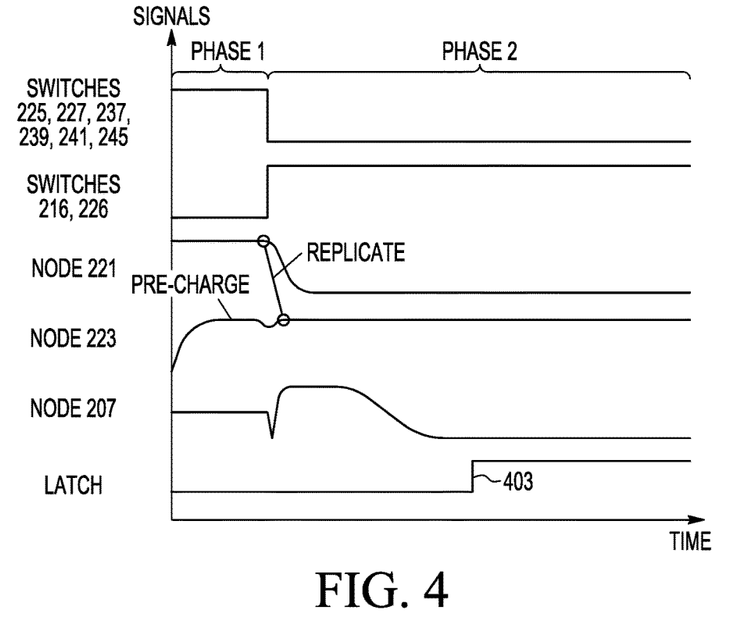
FIG. 4 is a timing diagram of a read operation of a memory cell according to one embodiment of the present invention.
Figure 5:
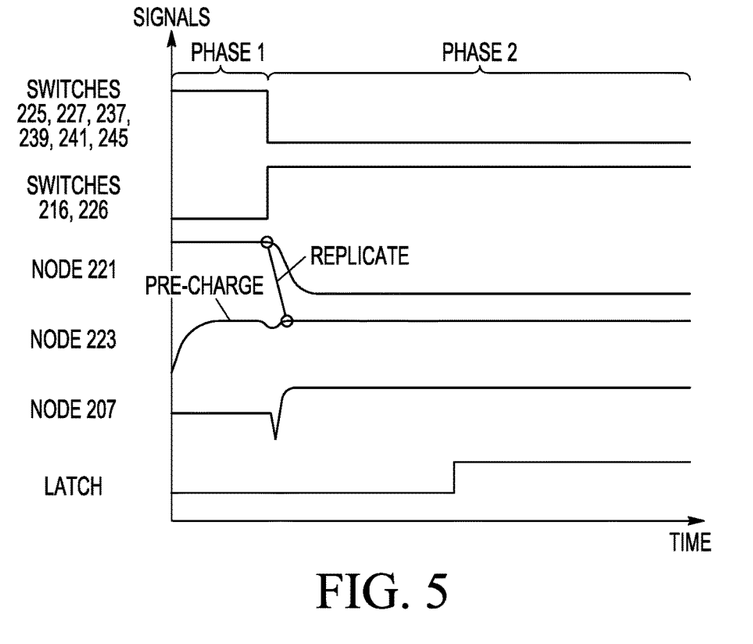
FIG. 5 is a timing diagram of another read operation of a memory cell according to one embodiment of the present invention.

FIG. 4 shows a timing diagram of the sense amplifier circuit of FIG. 2 during a read operation in reading a memory cell (e.g. 109) with a low resistive state. FIG. 5 shows the same circuit during a read operation in reading a memory cell with a high resistive state. In the timing diagrams of FIGS. 4 and 5, the switches listed for a signal are closed when the signal is at a high voltage value and are open when the signal is at a low voltage value. For example, switch 216 is open during Phase 1 (the signal is at a low voltage value) and is closed during Phase 2 (the signal is at a high voltage value).

As shown in FIGS. 4 and 5, the voltage of node 221 in Phase 1 is set by the current through path 205 by the BIAS voltage applied to the gate of clamping device transistor 213 and by the resistance of the reference cell 209. The voltage of node 223 is set to the voltage level by pre-charge circuit 252 and the resistance of the memory cell 109 during Phase 1. The voltage of node 207 is set by the current through reference path 205. As shown in FIGS. 4 and 5, the memory read operation transitions from Phase 1 to Phase 2 when switch control signals change switch states.

During Phase 2, the voltage on node 221 falls toward VSS with the opening of switches 239 and 225. Node 223 transitions from the pre-charge value to a voltage that is a replicated voltage of node 221 in Phase 1.

At the transition to Phase 2, the voltage at node 207 dips from its Phase 1 value for a small but finite time between switches 237 and 239 opening and switch 216 closing. The voltage level quickly recovers once switch 216 closes allowing the pullup current from the dynamic current mirror 231 to pull up node 207.

As shown in FIG. 4, making transistor 211 more conductive to increase the current through the sense path 203 causes the voltage of node 207 to drop to the low voltage level after a certain length of time from the beginning of Phase 2. Upon the rising edge (403) of the LATCH signal, the inverted value of node 207 is latched in latch 254. The LATCH signal is timed so that node 207 has an appropriate amount of time to transition to a state determinative of the storage state of the memory cell. In one embodiment, the rising edge 403 occurs in the range of 2-10 nanoseconds after the beginning of Phase 2. However, the time difference between the beginning of Phase 2 and the rising edge 403 of the LATCH signal may be different in different embodiments. In some embodiments, the time difference is dependent upon the gain of the inverting amplifier (inverter 218).

Figure 6:
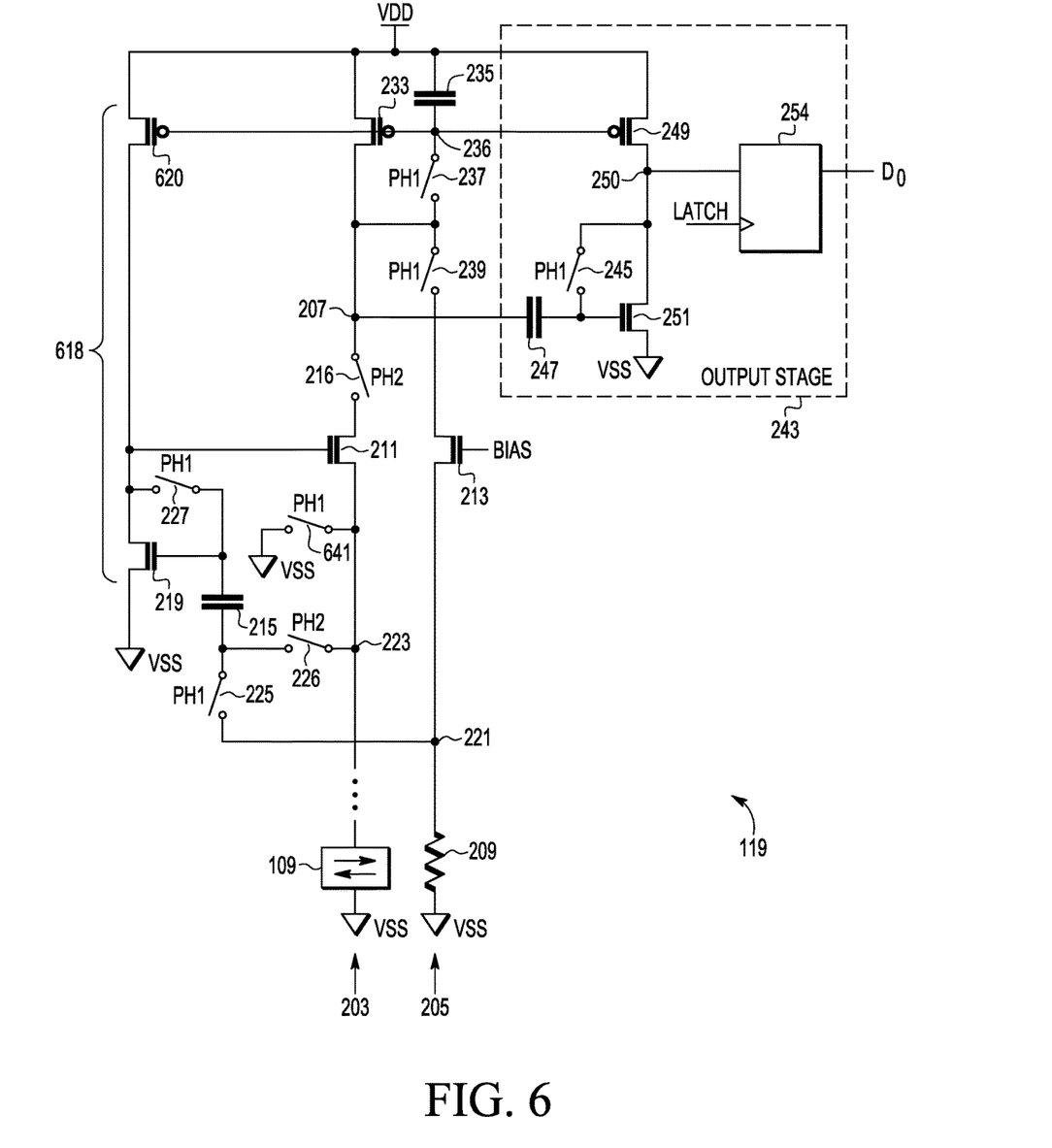
FIG. 6 is a circuit diagram of a sense amplifier circuit according to another embodiment of the presentation invention.

FIG. 6 is a circuit diagram of another embodiment of a sense amplifier circuit according to the present invention. The circuit of FIG. 6 is similar to the circuit of FIG. 2 where the same reference numbers represent similar devices. Also in FIG. 6, the switches are shown with a designation of "PH1" or "PH2" which indicates which Phase they are closed. For example, a "PH1" designation is shown for switch 225 indicating that it is closed during Phase 1 and open during Phase 2.

There are two main differences between the sense amplifier circuits of FIG. 2 and FIG. 6. First, in the circuit of FIG. 6, node 223 is pre-charged to VSS by switch 641 in Phase 1 instead of being pre-charged to a specific voltage by a pre-charge circuit 252 in FIG. 2. Also, inverting amplifier 618 has a different configuration than the inverting amplifier (inverter 218) in FIG. 2. In FIG. 6, inverting amplifier 618 is a common source with active load type amplifier wherein the source of transistor 620 is coupled to VDD and the gate is biased by node 236. A terminal of capacitor 215 is not connected to the gate of transistor 620.

Figure 7:
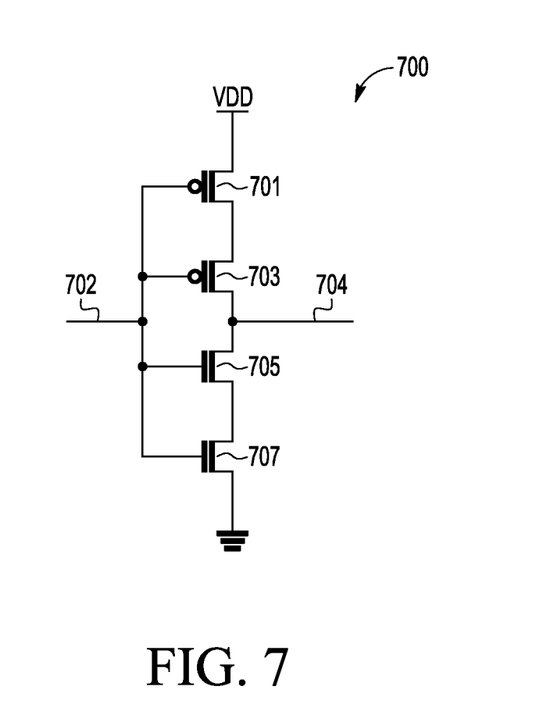
FIG. 7 is a circuit diagram of an inverting amplifier according to another embodiment of the presentation invention.

FIG. 7 shows a circuit diagram of an inverting amplifier according to another embodiment of the present invention. Inverting amplifier 700 is implemented as an inverter with 4 stacked transistors. Amplifier 700 includes PMOS transistors 701 and 703 and NMOS transistors 705 and 707. The input 702 of amplifier 700 is connected to the control gates of transistors 701, 703, 705, and 707, and the output 704 is connected to the drains of transistors 705 and 703. If amplifier 700 were implemented in the circuit of FIG. 2 in place of inverter 218, input 702 would connected to node 217 and output 704 would be connected to node 228. The source of the top transistor 707 is coupled to the supply node VDD, although it may be coupled to another supply node (VDD2) in other embodiments. The configuration of inverting amplifier 700 provides it with a higher gain than inverter 218, enabling for faster read margins and a more accurate replication of the reference voltage.

Figure 8:
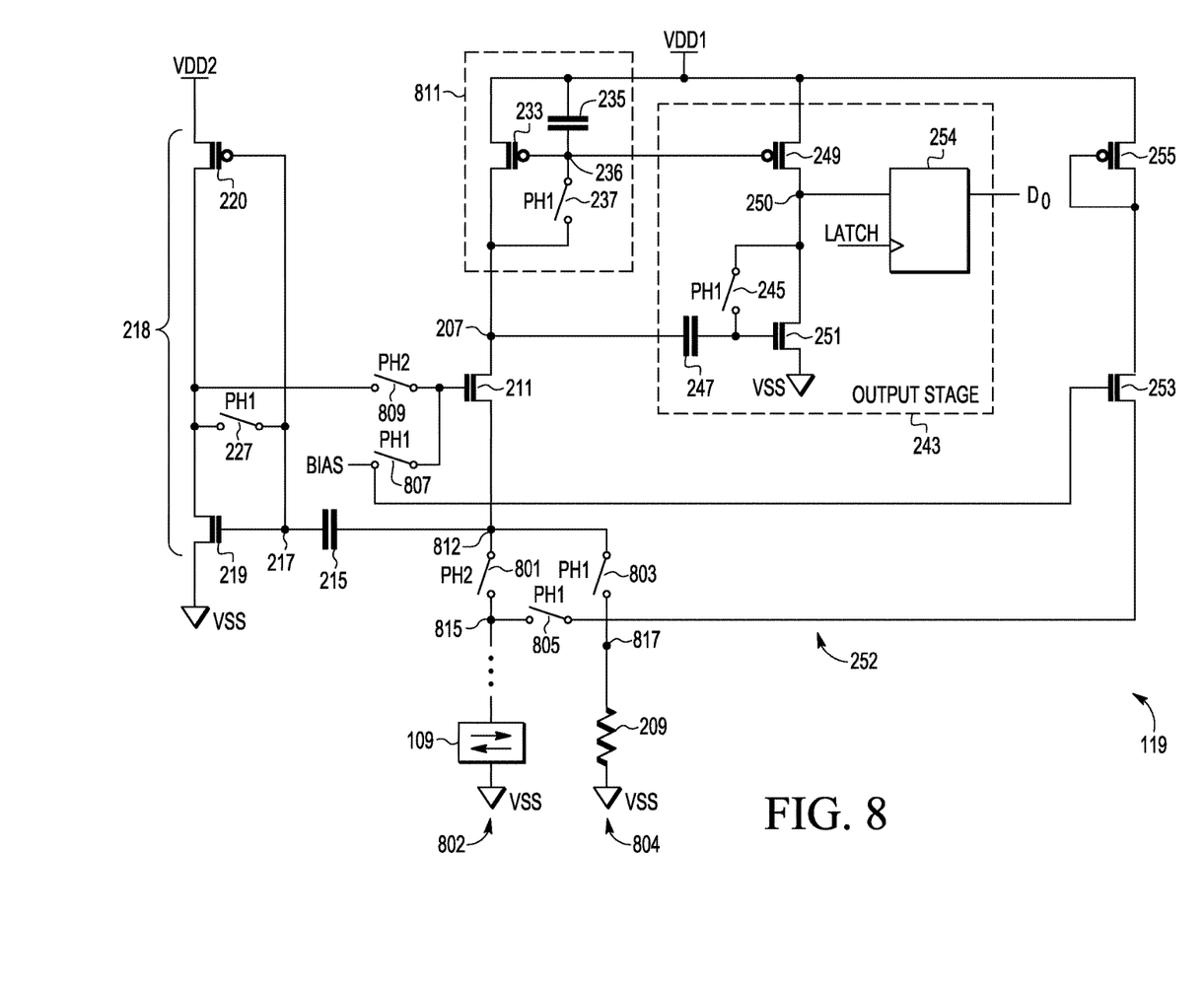
FIG. 8 is a circuit diagram of a sense amplifier circuit according to another embodiment of the presentation invention.

FIG. 8 is a circuit diagram of sense amplifier circuit according to another embodiment of the present invention. The circuit of FIG. 8 is similar to the circuit of FIG. 2 where the same reference numbers represent similar devices. Also in FIG. 8, the switches are shown with a designation of "PH1" or "PH2" which indicates which phase of the memory read operation they are closed.

A difference between the sense amplifier circuit of FIG. 8 and the sense amplifier circuit of FIG. 2 is that source follower (transistor 211) performs the function of the clamping device (transistor 213) in the embodiment of FIG. 2 in setting the current and voltages of the reference path 804 during Phase 1 of a memory read operation. During Phase 1, switch 803 is closed to couple a terminal of capacitor 215 (connected to node 812) to reference node 817 and to reference cell 209 of the reference path 804. Also during Phase 1, the gate of source follower (transistor 211) is biased by closed switch 807 to control the conductivity of transistor 211 and set the voltages at nodes 812, 817, and 236 when reference cell 209 is coupled to node 812. During Phase 1, the voltage of node 817 of reference path 804 is used to set the voltage of sampling capacitor 215. Also during Phase 1, switch 801 is open and switch 805 is closed such that node 815 of sense path 802 is pre-charged to a specific voltage (e.g. 100 mV) by pre-charge circuit 252.

During Phase 2, switches 803, 805, 807, 237, and 227 open and switches 801 and 809 close so that sense node 815 is coupled to node 812, the output of inverter 218 is coupled to the gate of transistor 211, node 815 is not being pre-charged by circuit 252, node 236 biases the gate of transistor 233, and node 817 is not coupled to node 812. The feedback loop of capacitor 215, inverter 218, and transistor 211 replicates at sense node 815, the voltage of reference node 817 set at Phase 1 and correspondingly keeps node 812 at its voltage level set during Phase 1. As with the sense amplifier circuit of FIG. 2, during Phase 2, the voltage of node 207 will be at a high voltage value if the memory cell 109 has a high resistive state or fall to a low voltage value if the memory cell 109 has a low resistive state at the rising edge of the LATCH signal.

In one embodiment, switches 801, 803, and 805 are located in sense amplifier circuit 119. However, in other embodiments, at least some of these switches may be located in other circuitry (e.g. decoder circuitry 117).

In other embodiments, sampling capacitor 215 may be implemented in other configurations in a sense amplifier circuit. For example, referring to FIG. 2, switches 226 and 225 can be connected to node 217 instead of node 240. Node 240 would be coupled to voltage source VSS. Accordingly, during Phase 1, capacitor 215 would store the voltage between node 221 and VSS. In such an embodiment, the circuit may include a switch that pre-charges the voltage of capacitor 215 upon the assertion of the LATCH signal.

With the sense amplifier circuits shown the Figures, capacitor 215 is coupled to reference cell 209 during Phase 1 of a memory read operation and then coupled to a memory cell (109) being read during Phase 2 of the read operation. The sense node (223, 815) is pre-charged during Phase 1 of the memory read operation. However in other embodiments, capacitor 215 would be coupled to the sense node (e.g. 223, 815) during Phase 1 and then coupled to the reference node 221 during Phase 2. The reference node 221 would be pre-charged in Phase 1. With these embodiments, capacitor 215 is used to sample a voltage that is based on the sense node voltage during Phase 1 of a memory read operation and then the sampled voltage is used to control the conductivity of transistor 211 to replicate the sense node voltage in the reference node during Phase 2 of a memory read operation. For example, in such a modification to the sense amplifier circuit 119 of FIGS. 2 and 6, reference cell 209 would be coupled to node 223 (and not node 221) and memory cell 109 would be coupled to node 221 (and not node 223). In such a modification to the sense amplifier circuit 119 of FIG. 8, reference cell 209 would be coupled to node 815 (and not node 817) and memory cell 109 would be coupled to node 817 (and not node 815).

In other embodiments, sense amplifier circuit 119 can be used to read complimentary memory cells where the complimentary memory cells are programmed at complementary storage states to store a data value. For example, with resistive complementary memory cells, a first complementary memory cell of a pair of complementary memory cells would be programmed to have a high resistive state and the second complementary cell of the pair would be programmed to have a low resistive state in order to store a specific data value (e.g. a "1" or "0"). To store the opposite data value, the first complementary memory cell would be programmed to have a low resistive state and the second complementary memory cell would be programmed to have a high resistive state. In the embodiments of the Figures, cells 109 and 209 would be complementary memory cells each programmed with the opposite resistive state to store a data value. In such an embodiment of the sense amplifier of FIG. 2, capacitor 215 is used to sample a voltage that is based on the voltage of node 221 which is coupled to one complementary memory cell during Phase 1 of a memory read operation, and then the sampled voltage is used to control the conductivity of transistor 211 to replicate the voltage at node 223 which is coupled to the other complementary memory cell during Phase 2.

Although the sense amplifier circuits shown are implemented with MOSFETS, a sense amplifier circuit can be implemented with other devices, e.g. bipolar transistors, in other embodiments. In addition, some embodiments of a memory read operation may include an additional phase in addition to Phase 1 and Phase 2. Also, features described herein with respect to one embodiment, may be implemented in other embodiments described herein.

In one embodiment, a sense amplifier circuit includes a capacitor. The capacitor includes a first terminal. During a first phase of a read operation of a memory cell, the first terminal of the capacitor is coupled to a first node of a first path to store a voltage based on a voltage of the first node and the first node is coupled to a first cell. During a second phase of a read operation, the first terminal is coupled to a second node of a second path and the second node is coupled to a second cell. The sense amplifier circuit includes an inverting amplifier including an input coupled to the capacitor during a second phase of a read operation. The inverting amplifier includes an output. The sense amplifier circuit includes a transistor including a control terminal coupled to the output of the inverting amplifier during a second phase of a read operation. The transistor includes a first current terminal coupled to the second node during a second phase of the read operation. The transistor includes a second current terminal coupled to an output node during a second phase of a memory read operation. The output node providing an indication of a storage state of a memory cell being read during a memory read operation.

In another embodiment, a method of reading a memory cell includes performing a first phase of a memory read operation. During the first phase, a first terminal of a capacitor is coupled a first node and the first node is coupled to a first cell. During the first phase, the first terminal is not coupled to a second node. The method includes performing a second phase of the memory read operation. During the second phase, the first terminal of the capacitor is coupled to the second node and the second node is coupled to a second cell. During the second phase, the first terminal of the capacitor is not coupled to the first node. During the second phase, the capacitor is coupled to an input of an inverting amplifier whose output controls a transistor. The transistor includes a first current terminal coupled to the second node during the second phase. The transistor includes a second current terminal coupled to an output node during the second phase that provides an indication of a storage state of a memory cell during the memory read operation.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:
1. A sense amplifier circuit comprising:
   a capacitor, the capacitor including a first terminal, wherein during a first phase of a read operation of a memory cell, the first terminal of the capacitor is coupled to a first node of a first path to store a voltage based on a voltage of the first node and the first node is coupled to a first cell, wherein during a second phase of a read operation, the first terminal is coupled to a second node of a second path and the second node is coupled to a second cell;

an inverting amplifier including an input coupled to the capacitor during a second phase of a read operation, the inverting amplifier includes an output;

a transistor including a control terminal coupled to the output of the inverting amplifier during a second phase of a read operation, the transistor including a first current terminal coupled to the second node during a second phase of the read operation, the transistor including a second current terminal coupled to an output node during a second phase of a memory read operation, the output node providing an indication of a storage state of a memory cell being read during a memory read operation.

2. The sense amplifier of claim 1 wherein the input of the inverting amplifier is coupled to a second terminal of the capacitor during a second phase of a read operation.

3. The sense amplifier of claim 2 further comprising:
a switching device, wherein the second terminal of the capacitor is coupled to the output of the inverting amplifier during a first phase of a memory read operation with the switching device in a closed position, wherein during a second phase of a memory read operation, the switching device is in an open position.

4. The sense amplifier circuit of claim 1 wherein the first cell is characterized as a reference cell and the second cell is characterized as a memory cell being read during a memory read operation.

5. The sense amplifier circuit of claim 1 wherein the second cell is characterized as a reference cell and the first cell is characterized as a memory cell being read during a memory read operation.

6. The sense amplifier circuit of claim 1 wherein the first cell and the second cell are characterized as a pair of complimentary memory cells with each cell of the first cell and the second cell being programmable at a complementary storage state to store a value that is read during a memory read operation.

7. The sense amplifier circuit of claim 1 wherein the control terminal of the transistor is coupled to a bias voltage during a first phase of a memory read operation.

8. A memory circuit comprising the sense amplifier circuit of claim 1 and further comprising:
an array of memory cells, the sense amplifier circuit is couplable to the array to determine a storage state of a memory cell of a set of at least one memory cell of the array.

9. The memory circuit of claim 8 wherein the array of memory cells is characterized as an array of resistive memory cells.

10. The sense amplifier circuit of claim 1 further comprising:
a pre-charge circuit, the pre-charge circuit biasing the second node during a first phase of a memory read operation wherein the second node is coupled to the second cell during a first phase of the memory read operation.

11. The sense amplifier circuit of claim 1 wherein the first terminal of the capacitor is coupled to the first current terminal of the transistor during a first phase of a memory read operation.

12. The sense amplifier circuit of claim 1 wherein the inverting amplifier is characterized as an inverter.

13. The sense amplifier circuit of claim 1 wherein the output of the inverting amplifier is coupled to the control terminal of the transistor during a first phase of a memory read operation and a second terminal of the capacitor is coupled to the input of the inverting amplifier during a first phase of a memory read.

14. The sense amplifier circuit of claim 1 further comprising:
a clamping device located in the first path, the first node is coupled to a first current terminal of the clamping device, wherein a bias voltage is applied to a control terminal of the clamping device during a first phase of a memory read operation for setting a voltage of the first node.

15. The sense amplifier circuit of claim 1 further comprising:
a second capacitor, wherein during a first phase of a read operation, a first terminal of the second capacitor is coupled to the first node, wherein during a second phase of a read operation, a voltage of the second capacitor controls the conductivity of a second transistor that includes a current terminal coupled to a second current terminal of the transistor during a second phase of a memory read operation.

16. A method of reading a memory cell comprising:
performing a first phase of a memory read operation, during the first phase, a first terminal of a capacitor is coupled a first node and the first node is coupled to a first cell, wherein during the first phase, the first terminal is not coupled to a second node;
performing a second phase of the memory read operation, during the second phase, the first terminal of the capacitor is coupled to the second node and the second node is coupled to a second cell, wherein during the second phase, the first terminal of the capacitor is not coupled to the first node, wherein during the second phase, the capacitor is coupled to an input of an inverting amplifier whose output controls a transistor, the transistor including a first current terminal coupled to the second node during the second phase, wherein the transistor includes a second current terminal coupled to an output node during the second phase that provides an indication of a storage state of a memory cell during the memory read operation.

17. The method of claim 16 further comprising:
biasing the second node to a first voltage during the first phase wherein the second cell is coupled to the second node during the first phase.

18. The method of claim 16 wherein a second terminal of the capacitor is coupled to the output of the inverting amplifier during the first phase with a switching device in a closed position, wherein during the second phase, the switching device is in an open position.

19. The method of claim 16 wherein during the first phase, the first node is set to a first voltage, wherein during the second phase, the output of the inverting amplifier controls the transistor to replicate the first voltage at the second node.

20. The method of claim 16 wherein during the second phase, a second terminal of the capacitor is coupled to an input of an inverting amplifier.

21. The method of claim 16 wherein the first cell is characterized as a reference cell and the second cell is characterized as a memory cell being read during the memory read operation.

22. The method of claim 16 wherein the second cell is characterized as a reference cell and the first cell is characterized as a memory cell being read during the memory read operation.

23. The method of claim 16 wherein the first cell and the second cell are characterized as complimentary memory cells with each cell the first cell and the second cell being programmable at a complementary storage state to store a value that is read during the memory read operation.

\* \* \* \* \*